(12) United States Patent
Tahmosybayat

(10) Patent No.: US 7,810,962 B2
(45) Date of Patent: Oct. 12, 2010

(54) LENS ASSEMBLY

(76) Inventor: Ghollam Tahmosybayat, 48 Hutton Close Crowther Washington, Tyne & Wear (GB) NE38 0AH (*) Notice: Subject to any disclaimer, the term of this patent is extended or adjusted under 35 U.S.C. 154(b) by 226 days.

(21) Appl. No.: 12/280,913

(22) PCT Filed: Sep. 29, 2006

(86) PCT No.: PCT/GB2006/003613

§ 371 (c)(1),
(2), (4) Date: Aug. 27, 2008

(87) PCT Pub. No.: WO2007/099273

PCT Pub. Date: Sep. 7, 2007

(65) Prior Publication Data

US 2009/0067180 A1    Mar. 12, 2009

(30) Foreign Application Priority Data

Feb. 28, 2006  (GB) ................. 0604250.1

(51) Int. Cl.
*F21V 5/04* (2006.01)
(52) U.S. Cl. ...................... 362/329; 362/328
(58) Field of Classification Search ................ 362/226, 362/328, 329, 334
See application file for complete search history.

(56) References Cited

U.S. PATENT DOCUMENTS

| | | | |
|---|---|---|---|
| 2,215,900 A | 9/1940 | Bitner | |
| 5,704,709 A * | 1/1998 | Zwick et al. | ................. 362/329 |
| 6,402,347 B1 | 6/2002 | Maas et al. | |
| 7,489,453 B2 * | 2/2009 | Chinniah et al. | ............ 362/334 |
| 2002/0080615 A1 | 6/2002 | Marshall et al. | |
| 2003/0137838 A1 | 7/2003 | Rizkin et al. | |
| 2006/0028829 A1 | 2/2006 | Amano et al. | |

FOREIGN PATENT DOCUMENTS

| | | |
|---|---|---|
| CN | 1688029 | 10/2005 |
| GB | 2391702 | 2/2004 |
| JP | 2003035883 | 2/2003 |

OTHER PUBLICATIONS

English Abstract provided for JP-2003035883.

* cited by examiner

*Primary Examiner*—David V Bruce
(74) *Attorney, Agent, or Firm*—Rader, Fishman & Grauer PLLC

(57) ABSTRACT

A lens assembly (4) comprises a body (6) formed from a transparent material. The body (6) is mounted on an LED chip (8) comprising an LED (10). The LED (10) is disposed in a recess (12) formed in the body (6) such that the LED 10 is positioned on the longitudinal axis Z of the lens assembly (4). A convex lens (14) is formed in the aperture (12). The outer surface (16) of the lens assembly (4) comprises a plurality of flat surfaces in concentric rings that form a plurality of optical steps (18). The length of the respective steps increases towards the base (7) of the body (6). A central dimple (20) is disposed on axis Z. The dimple (20) prevents a black spot appearing when the lens assembly (4) is viewed along axis Z.

17 Claims, 6 Drawing Sheets

US 7,810,962 B2

LENS ASSEMBLY

CROSS-REFERENCE TO RELATED APPLICATION

This application is a National Stage application which claims the benefit of International Application No. PCT/GB2006/003613 filed Sep. 29, 2006 which claims priority based on Great Britain Application No. GB060425.1, filed Feb. 28, 2006, all of which are hereby incorporated by reference in their entirety.

The present invention relates to a lens assembly for redirecting light emitted by a light source, and relates particularly, but not exclusively, to a lens assembly for redirecting light emitted by a light emitting diode (LED).

LEDs have several advantages over conventional filament or halogen bulbs. Since LEDs do not have a filament, the filament cannot burn out which gives an LED longer life compared with both filament and halogen bulbs. As LEDs are generally in the shape of small plastic bulbs they are also very durable. LEDs are also generally more efficient than filament and halogen bulbs since only very small amounts of heat are generated by LEDs compared with filament and halogen bulbs.

However, LEDs can suffer from the drawback that they generally only emit light in one direction, whereas filament and halogen bulbs emit light over a greater angular range.

FIG. 1 shows the light distribution pattern of an LED 2. Due to the shape of the transparent outer plastic case of the LED 2 most of the light is emitted forwardly from the LED 2. The intensity of emitted light decreases in the radial direction such that only a small proportion of the light emitted by the LED is emitted radially.

Lens assemblies are known such as that described in EP1376708 which redirect light emitted from the LED in the radial direction. Only a small amount of light is emitted axially using such a lens assembly.

It is desirable to be able to redirect light emitted by the LED in both the axial and radial directions.

Preferred embodiments of the present invention therefore seek to provide a lens assembly for redirecting light emitted by an LED in both the axial and radial directions.

According to an aspect of the present invention, there is provided a lens assembly for redirecting light emitted by a light source, the lens assembly comprising:

an at least partially transparent body having a longitudinal axis and a recess for receiving a light source; and a first surface disposed adjacent the recess and adapted to reflect a portion of light emitted by the light source such that said portion of light is emitted from the assembly transversely to said longitudinal axis, and wherein the first surface is adapted to transmit a further portion of light emitted by the light source such that said further portion of light is emitted from the assembly in a direction substantially parallel to said longitudinal axis.

This provides the advantage of redirecting light in both the axial and radial directions of emission from the light source.

In a preferred embodiment, the assembly further comprises a second surface adapted to scatter light emitted by the assembly.

This provides the advantage of increasing the angular range over which light is emitted.

In a preferred embodiment, said second surface comprises a plurality of optical steps forming a Fresnel lens contour.

Each said optical step comprises a ring formed about the longitudinal axis and forms a deviating prism.

Each said optical step has a different angle with respect to the longitudinal axis.

Said second surface may comprise a dimple disposed on the longitudinal axis.

This provides the advantage of scattering light travelling along the longitudinal axis of the body.

Said first surface may be substantially part spherical.

In a preferred embodiment, said body may be rotationally symmetrical about the longitudinal axis.

The assembly may further comprise a reflective material disposed adjacent a base of the body.

This provides the advantage of reflecting back-scattered light back into the lens assembly.

The body may comprise a flange portion.

This provides the advantage of increasing the footprint of the lens to facilitate positioning of the lens in a lighting assembly.

Said flange portion may be formed integrally with the body.

Said body may be formed from glass, epoxy or polymeric material.

Said body may have a refractive index of between 1.3 and 1.7.

In a preferred embodiment, said body has a refractive index of approximately 1.53.

Preferred embodiments of the present invention will now be described, by way of example only and not in any limitative sense, with reference to the accompanying drawings in which.

Figure 1:
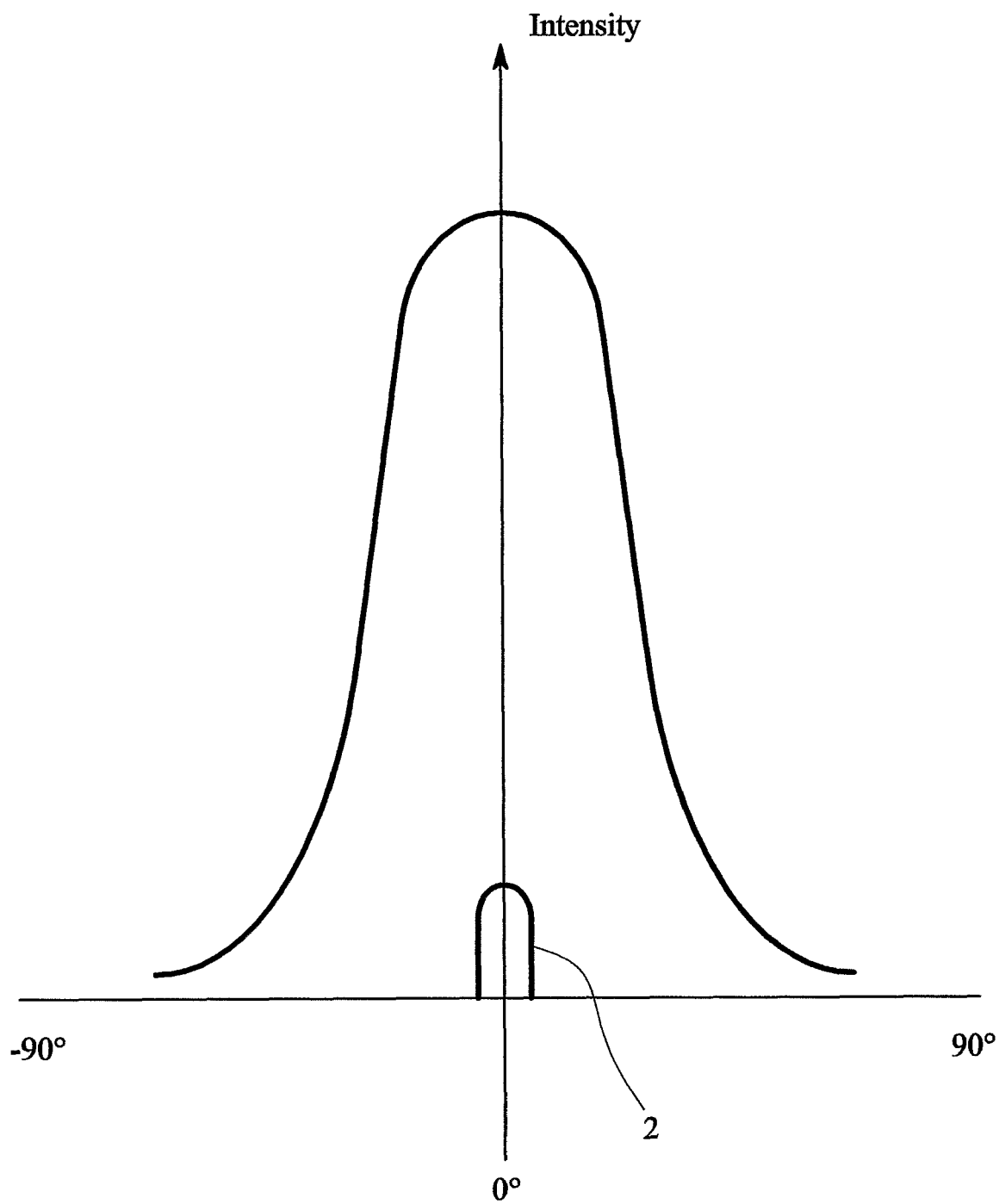
FIG. 1 is a graph showing distribution of light emitted from an LED.
Figure 2:
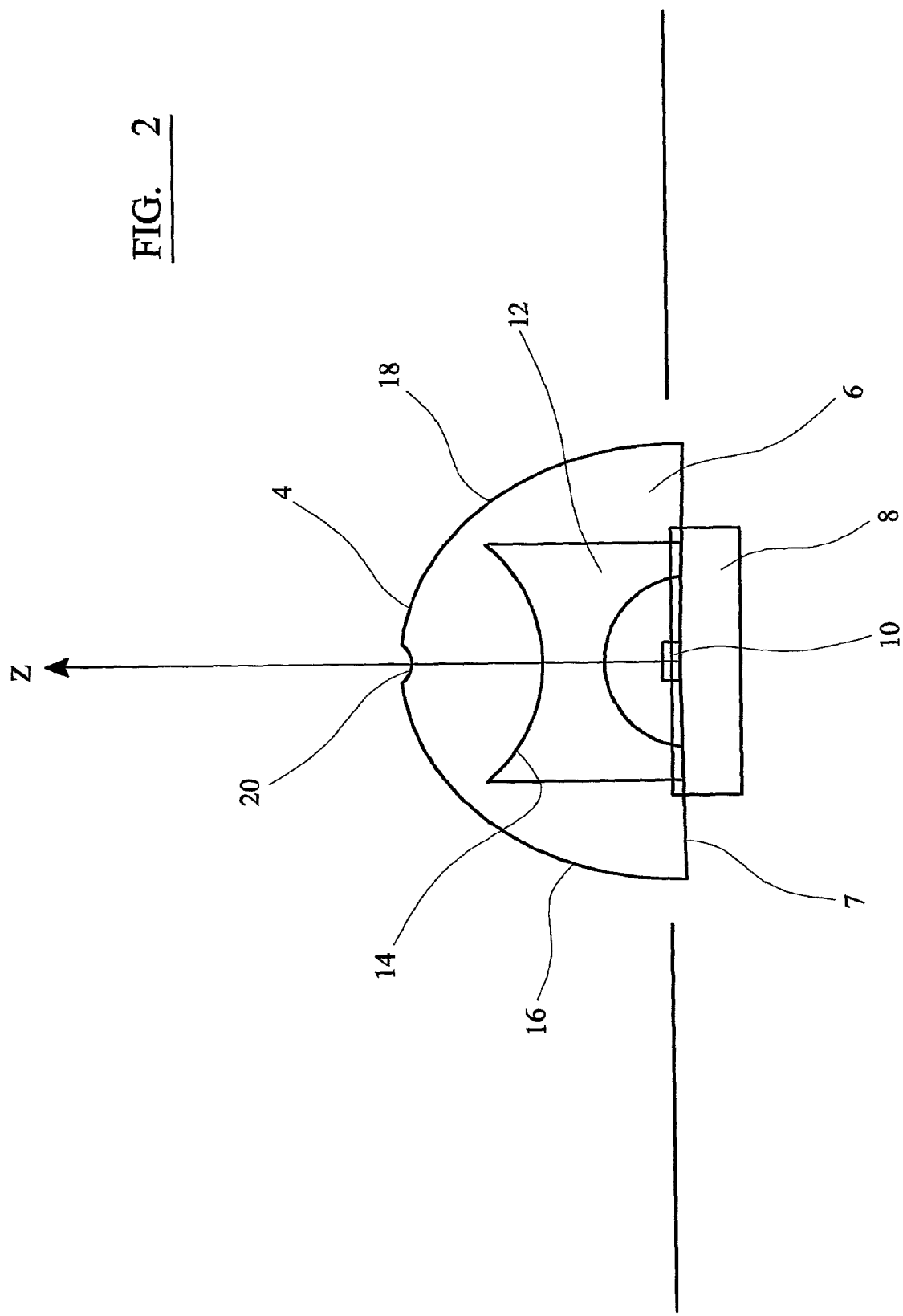
FIG. 2 is a cross sectional view of a lens assembly embodying the present invention for redirecting light emitted by a light source.
Figure 3:
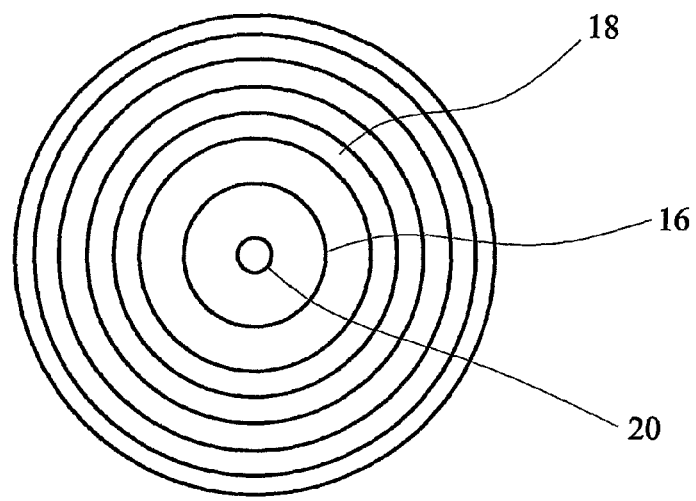
FIG. 3 is a top view of the lens assembly of FIG. 2.
Figure 4:
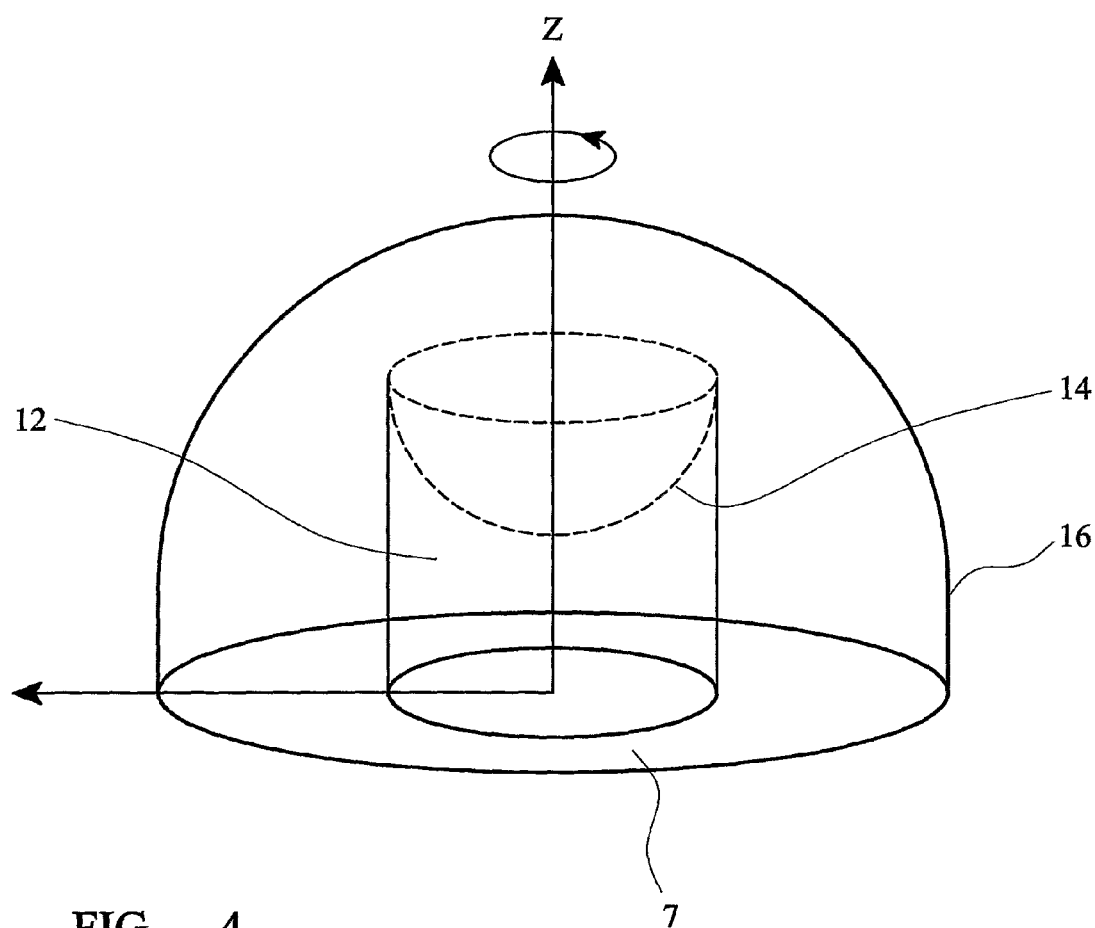
FIG. 4 is a perspective view of the lens assembly of FIG. 1 in which the Fresnel optical steps have been removed for clarity.

Referring to FIGS. 2 to 4, a lens assembly 4 comprises a body 6 formed from a transparent material having a refractive index of between 1.3 and 1.7 and preferably 1.53 for use with LEDs that emit UV, visible and infra-red electromagnetic radiation. The body may be formed from an injection moulded polymeric material or any other suitable material and manufacturing process that would be apparent to persons skilled in the art.

The body 6 is mounted on an LED chip 8 comprising an LED 10. The LED 10 is disposed in a recess 12 formed in the body 6 such that the LED 10 is positioned on the longitudinal axis Z of the lens assembly 4.

A convex lens 14 is formed in the aperture 12. Convex lens may be a spherical lens. The outer surface 16 of the lens assembly 4 comprises a plurality of flat surfaces in concentric rings that form a plurality of optical Fresnel steps 18. Each Fresnel step 18 is in the form of a ring formed about axis Z and is moulded into the surface of lens 4 to form a small deviating prism. Each step has a different angle with respect to axis Z. A central dimple 20 is disposed on axis Z. The dimple 20 prevents a black spot appearing when the lens assembly 4 is viewed along axis Z. Base 7 of the lens 4 may be coated with a reflective coating to reflect any back-scattered light back into the body 6. Alternatively, the reflective material may be moulded into lens 4, printed on lens 4 or placed adjacent lens 4.

Figure 5:
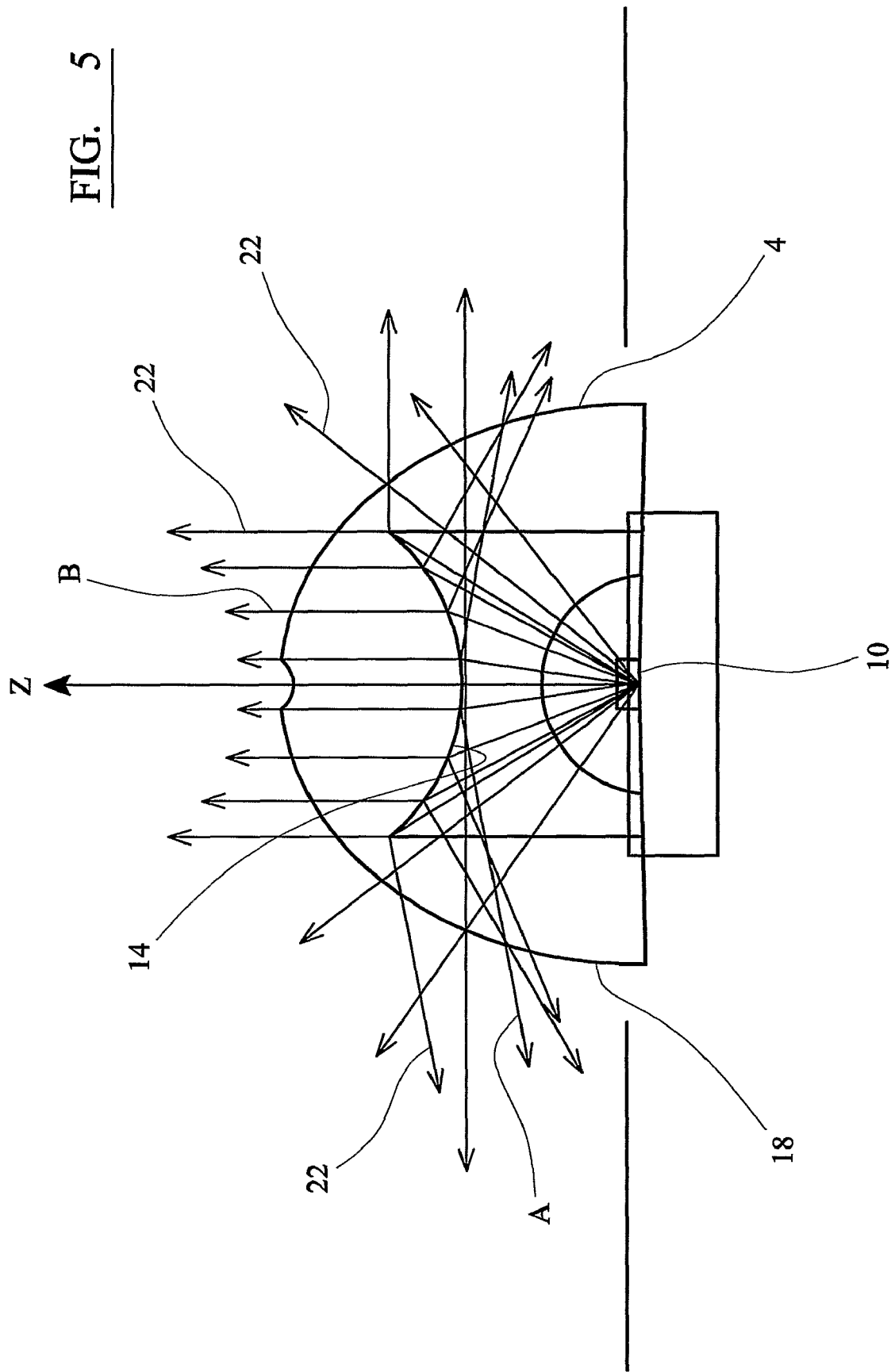
FIG. 5 is a cross section of the lens assembly of FIG. 1 showing the redirection of light rays within the assembly.

Referring to FIG. 5, the operation of the lens assembly 4 will now be described. Light rays 22 emitted from LED 10 are either totally internally reflected such as ray A, or transmitted, such as ray B, by convex lens 14. Rays that are totally internally reflected (e.g. ray A) are then emitted in a generally radial direction relative to axis Z. Light rays that are transmitted by convex lens 14 (e.g. ray B) are emitted in a direction generally parallel to longitudinal axis Z. Fresnel steps 18 cause scattering of light emitted from the Lens 4 to increase the angular distribution of light emitted by the lens assembly 4.

Figure 6:
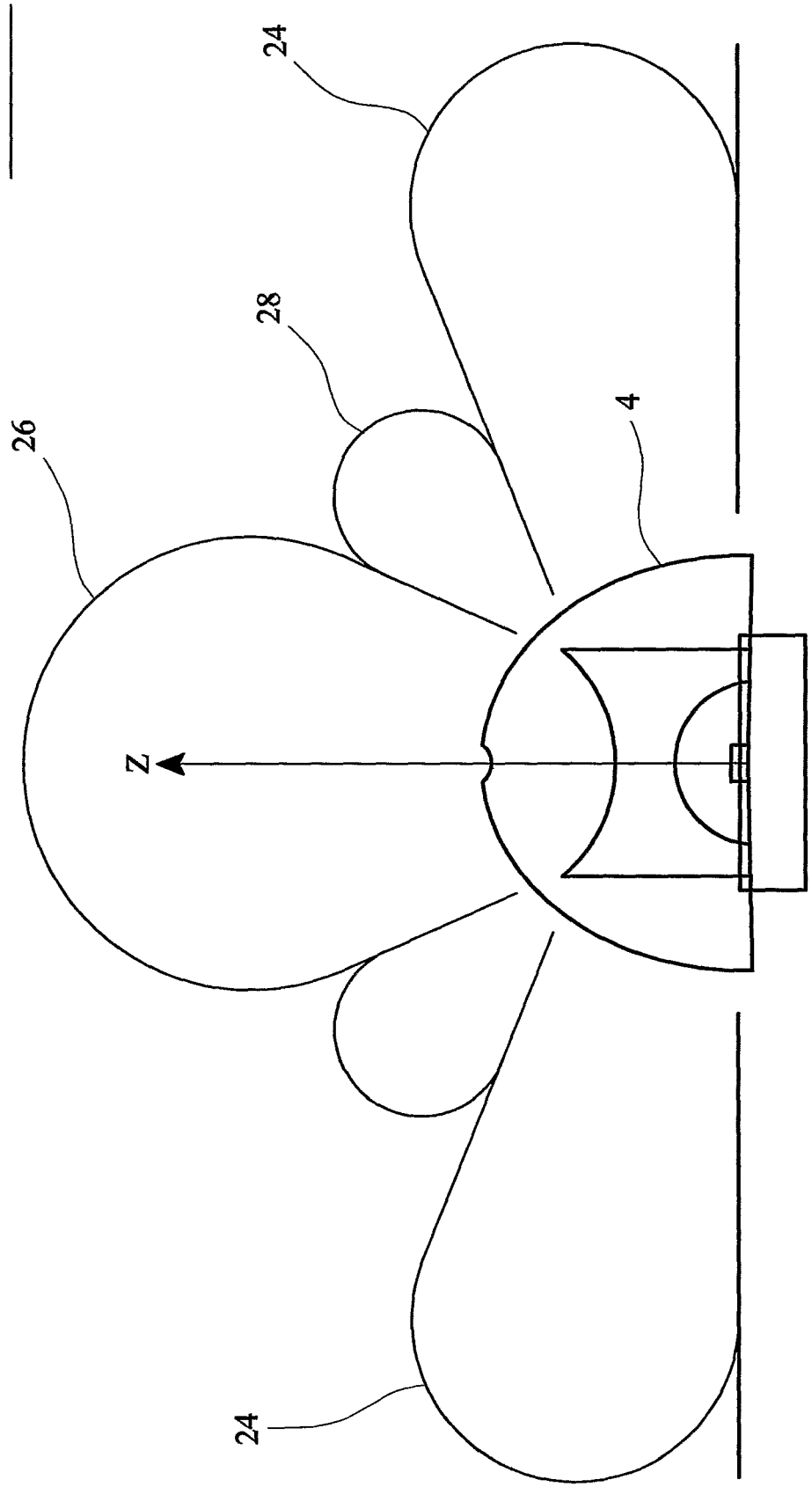
FIG. 6 is a cross section of the lens assembly of FIG. 1 showing the emitted light intensity distribution pattern.

Referring to FIG. 6, the light distribution pattern of lens assembly 4 comprises a radial maximum 24 which is emitted about 360° of the lens assembly 4. A vertical maximum 26 is emitted substantially along the Z axis of the Lens assembly 4. A minimum 28 is emitted between maxima 24 and 26.

Figure 7:
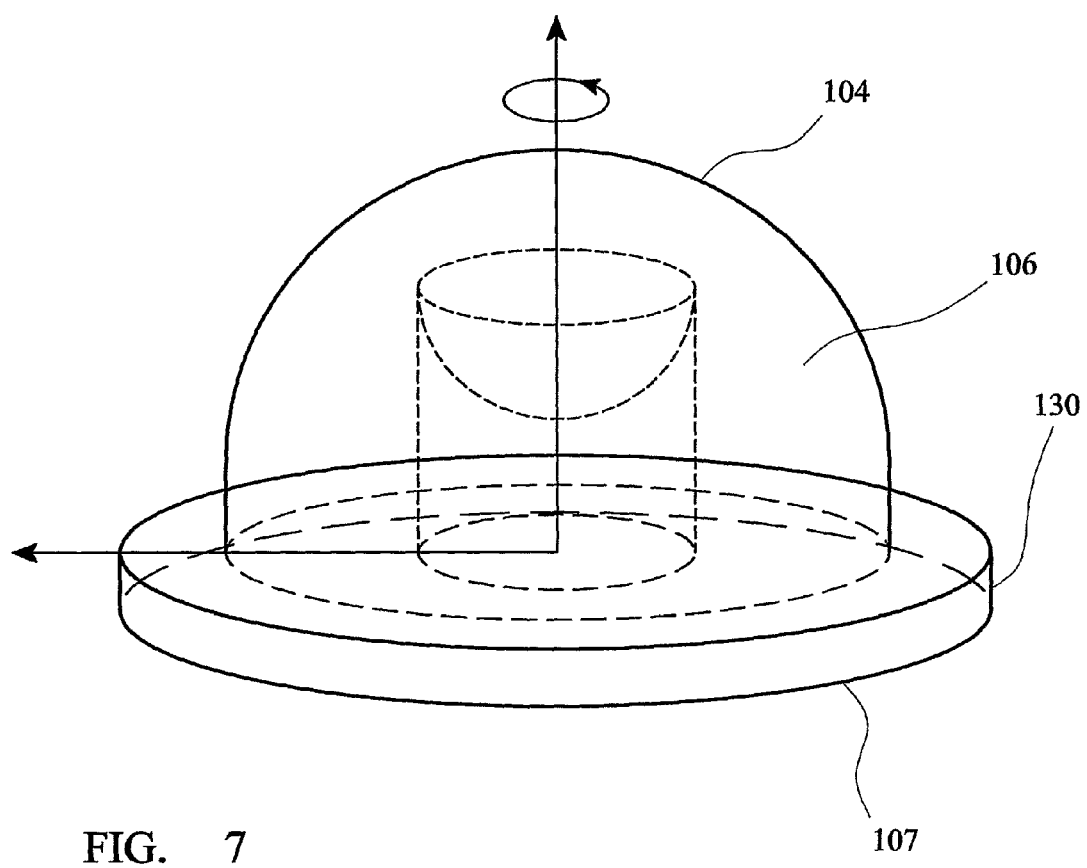
FIG. 7 is a perspective view of a lens of second embodiment of the present invention.
Figure 8:
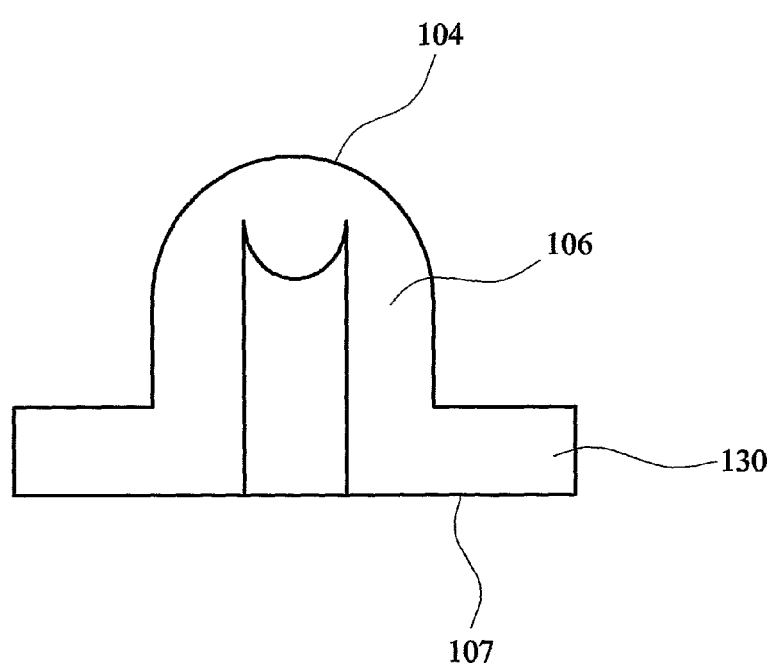
FIG. 8 is a cross sectional view of the lens of FIG. 7.

A second embodiment of the lens assembly is shown in FIGS. 7 and 8, with parts common to the embodiment of FIGS. 2 to 6 denoted with like reference numerals but increased by 100.

Lens 104 comprises a body 106 and a flange 130. Flange 130 may be a separate part, or may be moulded integrally with body 106. Flange 130 increases the footprint of the lens 104 to facilitate positioning of the lens in a lighting assembly. Base 107 of lens 104 may be coated with a reflective coating to reflect back-scattered light back into body 106. Alternatively, the reflective material may be moulded into lens 104, printed on lens 104 or placed adjacent lens 104.

It will be appreciated by persons skilled in the art that the above embodiments have been described by way of example only, and not in any limitative sense, and that various alterations and modifications are possible without departure from the scope of the invention as defined by the appended claims. In particular, the lens assembly 4 may be used with light sources other than LEDs.

The invention claimed is:

1. A lens assembly for redirecting light emitted by a light source, the lens assembly comprising:
   an at least partially transparent body having a longitudinal axis and a recess for receiving a light source; and
   a first surface disposed adjacent the recess and adapted to reflect a portion of light emitted by the light source such that said portion of light is emitted from the assembly transversely to said longitudinal axis, and wherein the first surface is adapted to transmit a further portion of light emitted by the light source such that said further portion of light is emitted from the assembly in a direction substantially parallel to said longitudinal axis.

2. An assembly according to claim 1, further comprising a second surface adapted to scatter light emitted by the assembly.

3. An assembly according to claim 2, wherein said second surface comprises a plurality of optical steps forming a Fresnel lens contour.

4. An assembly according to claim 3, wherein each optical step comprises a ring formed about the longitudinal axis and forms a deviating prism.

5. An assembly according to claim 3, wherein each said optical step has a different angle with respect to the longitudinal axis.

6. An assembly according to claim 2, wherein said second surface further comprises a dimple disposed on the longitudinal axis.

7. An assembly according to claim 1, wherein said first surface is substantially part spherical.

8. An assembly according to claim 1, wherein said body is rotationally symmetrical about the longitudinal axis.

9. An assembly according to claim 1, further comprising a reflective material disposed adjacent a base of the body.

10. An assembly according to claim 1, wherein the body comprises a flange portion.

11. An assembly according to claim 10, wherein said flange is formed integrally with the body.

12. An assembly according to claim 1, wherein the body is one of a glass, epoxy and polymeric material.

13. An assembly according to claim 1, wherein the body has a refractive index of between approximately 1.3 and approximately 1.7.

14. An assembly according to claim 13, wherein the body has a refractive index of approximately 1.53.

15. A lens assembly for redirecting light emitted by a light source, the lens assembly comprising:
   an at least partially transparent body having a longitudinal axis, a recess and a flange, the recess receiving a light source, the body being rotationally symmetrical about the longitudinal axis, and the flange being integral with the body;
   a substantially part spherical first surface disposed adjacent the recess and adapted to reflect a portion of light emitted by the light source such that the portion of light is emitted from the assembly transversely to the longitudinal axis, and wherein the first surface is adapted to transmit a further portion of light emitted by the light source such that the further portion of light is emitted from the assembly in a direction substantially parallel to the longitudinal axis;
   a second surface adapted to scatter light emitted by the assembly, wherein the second surface comprises a plurality of optical steps creating a Fresnel lens contour and a dimple disposed on the longitudinal axis, each optical step comprising a ring about the longitudinal axis and creating a deviating prism, and wherein each of the optical steps has a different angle with respect to the longitudinal axis; and
   a reflective material disposed adjacent a base of the body;
   wherein the body has a refractive index of between approximately 1.3 and approximately 1.7.

16. An assembly according to claim 15, wherein the body is one of a glass, epoxy and polymeric material.

17. An assembly according to claim 15, wherein the body has a refractive index of approximately 1.53.

* * * * *

UNITED STATES PATENT AND TRADEMARK OFFICE
CERTIFICATE OF CORRECTION

| | | |
|---|---|---|
| PATENT NO. | : 7,810,962 B2 | Page 1 of 1 |
| APPLICATION NO. | : 12/280913 | |
| DATED | : October 12, 2010 | |
| INVENTOR(S) | : Ghollam Tahmosybayat | |

It is certified that error appears in the above-identified patent and that said Letters Patent is hereby corrected as shown below:

Title Page, Item (87) PCT NO

WO2007/0099273, should read WO2007/009927<u>5</u>

Signed and Sealed this
Nineteenth Day of July, 2011

David J. Kappos
*Director of the United States Patent and Trademark Office*